United States Patent [19]

Joyner et al.

[11] Patent Number: 4,507,851
[45] Date of Patent: Apr. 2, 1985

[54] PROCESS FOR FORMING AN ELECTRICAL INTERCONNECTION SYSTEM ON A SEMICONDUCTOR

[75] Inventors: Keith A. Joyner, Richardson; Ronald B. Foster, Garland, both of Tex.

[73] Assignee: Texas Instruments Incorporated, Dallas, Tex.

[21] Appl. No.: 373,778

[22] Filed: Apr. 30, 1982

[51] Int. Cl.³ .................... C23C 15/00; H01L 21/443
[52] U.S. Cl. ..................................... 29/590; 156/653; 156/657; 156/659.1; 204/192 EC; 204/192 E; 427/89
[58] Field of Search ...... 204/192 C, 192 SP, 192 EC, 204/192 E; 427/88, 89; 357/715; 29/590; 156/643, 657, 659.1, 653

[56] References Cited

U.S. PATENT DOCUMENTS

| | | | |
|---|---|---|---|
| 3,287,612 | 11/1960 | Lepselter | 357/715 |
| 3,341,753 | 9/1967 | Cunningham et al. | 317/234 |
| 3,573,570 | 4/1971 | Fuller et al. | 317/235 |
| 3,754,168 | 8/1973 | Cunningham et al. | 317/234 R |
| 3,906,540 | 9/1975 | Hollins | 357/15 |
| 3,968,272 | 7/1976 | Anand | 427/84 |
| 4,102,733 | 7/1978 | De La Moneda et al. | 156/653 |
| 4,129,848 | 12/1978 | Frank et al. | 338/308 |
| 4,310,568 | 1/1982 | Howard et al. | 427/84 |
| 4,436,582 | 3/1984 | Saxena | 156/656 |

OTHER PUBLICATIONS

Cuomo et al., Substrate Cleaning by Low Energy Bombardment, *IBM Technical Disclosure Bulletin*, vol. 10, No. 4, Sep. 1967, pp. 352-353.
Brian Chapman, *Glow Discharge Processes*, John Wiley & Sons, New York, 1980, pp. 253-255.
J. M. Poate et al., *Thin Films-Interdiffusions and Reactions*, John Wiley & Sons, New York, 1978, pp. 359-405.

*Primary Examiner*—G. L. Kaplan
*Assistant Examiner*—W. T. Leader
*Attorney, Agent, or Firm*—Kenneth C. Hill; N. Rhys Merrett; Melvin Sharp

[57] ABSTRACT

Disclosed is a process for depositing a metal film on a silicon oxide or silicon nitride surface. This process provides an extremely adherent metallic film and is resistant to interdiffusion between the semiconductor, the insulator, and the metal. The process includes forming contact openings through an insulating layer to a silicon substrate; sputter etching the insulating layer and exposed substrate; depositing layers of platinum, a barrier metal and a conducting metal; and heating to form platinum silicide in the contact openings. The process is useful in forming an electrical interconnection system on a semiconductor device.

4 Claims, 7 Drawing Figures

PROCESS FOR FORMING AN ELECTRICAL INTERCONNECTION SYSTEM ON A SEMICONDUCTOR

BACKGROUND OF THE INVENTION

The development of contact systems and interconnection systems for electronic devices integrated on a single substrate has been under development for some years. A multilevel system can be useful in providing a plurality of metal connection lines which may overlap each other without making electrical contact and also may provide for more than one layer of metal in the contact itself. A Schottky barrier type of contacting metal, for example platinum, is commonly used as a Schottky contact metal and subsequent to sintering to form platinum silicide at the surface of the semiconductor, is overlain with a layer of titanium tungsten to provide interdiffusion protection to the contact.

Another aspect of the metallization system is the requirement of reduced intermigration of the molecules at the contact surface which has the potential to cause "poisoning" of the active device or which can cause significant resistivity maintenance problems in the electrical conductor. For example, see U.S. Pat. No. 3,573,570 patented Apr. 6, 1971, which provides a good introduction to this technology as well as U.S. Pat. No. 3,754,168 patented Aug. 21, 1973, entitled Metal Contact and Interconnection System for Nonhermetic Enclosed Semiconductor Devices. Several of these problems as well as the problem of adherence to the surface are discussed in the U.S. Pat. No. 3,341,753 issued Sept. 12, 1967. The adherence problem of high conductivity metals to silicon oxide is noted.

Also, it has been taught that "Platinum and palladium themselves do not form oxide layers easily, and consequently their adhesion to thick layers of silicon dioxide is rather poor." Quoting from the text "Thin Films Interdiffusion and Reactions, edited by J. M. Poate, K. N. Tu and J. W. Mayer on p. 380. That chapter entitled, Silicide Formation, chapter 10, is incorporated herein by reference as are the above-identified U.S. patents.

Accordingly, it is an object of the present invention to provide a process for forming an adherent metallic film on an insulator while at the same time reducing interdiffusion problems and reducing the number of process steps required.

Another object of the present invention is to provide a process for forming an adherent platinum film on the surface of an insulator.

A yet further object of the present invention is to provide an adherent metallic film on the surface of a silicon oxide or a silicon nitride material.

SUMMARY OF THE INVENTION

Briefly, in accordance with the present invention, a process is provided for forming an adherent metallic film on an insulator comprising the steps of providing a silicon substrate having an insulator on the surface, placing the substrate into a depositing chamber, and thereafter providing an inert environment within the chamber, sputter etching the insulator surface layer and thereafter depositing a layer of metal onto said insulator while continuously maintaining the inert environment.

A process as above in accordance with the present invention may further comprise the formation of a metallic film of platinum and the insulator may be comprised of a silicon oxide or a silicon nitride. In a preferred embodiment the metallic film comprises an electrically conductive element of an integrated circuit.

DETAILED DESCRIPTION OF THE DRAWINGS

Figure 1:
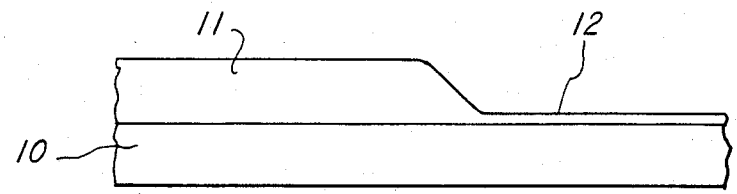
FIG. 1 is a cross-sectional view of a semiconductor substrate having a partial covering of silicon oxide.

Referring now to FIG. 1, a cross-sectional view of a semiconductor substrate having a partial overlying layer of insulator material. In this case silicon oxide is shown. Substrate 10 is a silicon wafer in cross-sectional view having a patterned silicon oxide layer 11 on the surface and subsequent to the oxide patterning, a native oxide layer 12 is formed over that portion of the substrate to be built as a Schottky contact.

Figure 2:
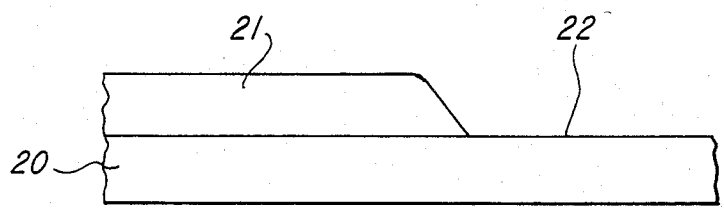
FIG. 2 illustrates a cross-sectional view of a semiconductor substrate having a partial covering of silicon oxide and the native oxide having been removed from a portion of the surface of the substrate.

Referring now to FIG. 2, the substrate is placed into a sputtering chamber and an inert environment is developed in accordance with commonly accepted semiconductor practice. This inert environment normally includes a vacuum pumpdown and filling the chamber with an inert gas such as argon or other heavy ionic inert gas. Substrate 20 is then exposed to a sputter etch for sufficient time to completely remove the native oxide from surface 22 and at the same time a corresponding depth of silicon oxide is removed from the surface of silicon oxide layer 21. Sputter etch rates vary generally in response to variations in density of the etched material; however, the depth of the etch, normally 75 angstroms in this case, may be varied in order to completely remove the native oxide from the surface 22, and since the silicon oxide layer 21 is normally on the order of 1000 angstroms or more, an insignificant amount of insulator is removed.

Figure 3:
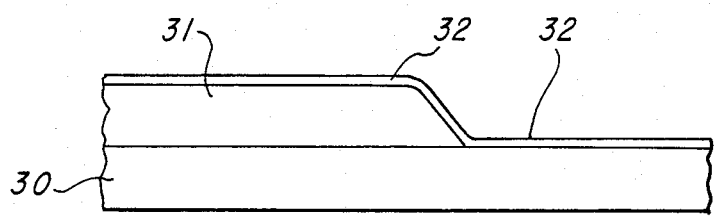
FIG. 3 is a semiconductor substrate having a partial covering of silicon oxide and a completely overlying layer of metal.

Referring now to FIG. 3, a sputter-deposition of platinum 32 is then conducted to deposit a layer of platinum over the entire surface on the order of 100 to 1000 angstroms in thickness. Note the silicon oxide layer 31 has an overlying layer of platinum as does the opened contact area of the substrate 30. It is important to note that this platinum deposition step takes place immediately after the sputter etch step above described in FIG. 2.

Figure 4:
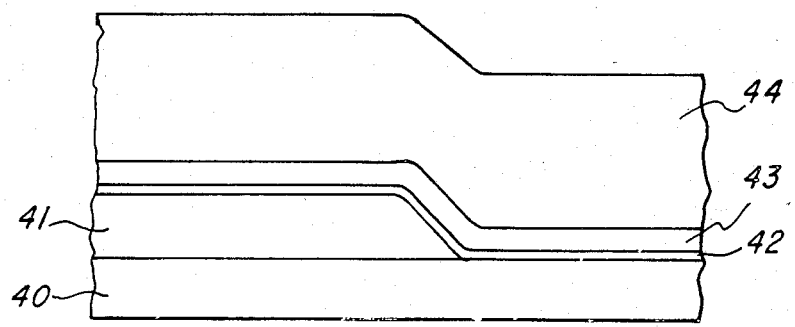
FIG. 4 illustrates a semiconductor substrate having a partial covering of silicon oxide and three layer metal overlying layers.

Referring now to FIG. 4, the three layers of metallization shown the platinum 42, titanium tungsten 43, and aluminum 44 are shown overlying the silicon oxide 41 and the exposed portion of the silicon substrate 40. Note the respective differences in thickness of layers wherein the platinum 42 is on the order of 100 to 1000 angstroms and the titanium tungsten is on the order of 500 to 2000 angstroms whereas the aluminum is very much thicker on the order of 9,000 to 20,000 angstroms and thus provides a very low resistive conduction path while the titanium tungsten layer protects the silicon surface from aluminum interdiffusion into the surface.

Figure 5:
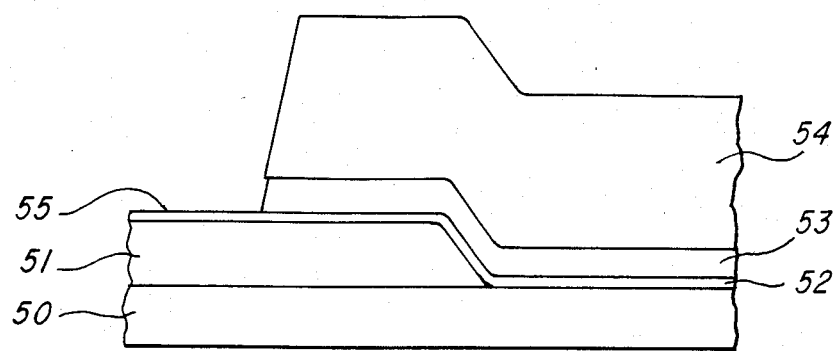
FIG. 5 illustrates a semiconductor substrate having a partial covering of silicon oxide and a multilayer metallic overlying layer having a portion of the metallization defined.

Referring now to FIG. 5, the aluminum layer 54 and titanium tungsten layer 53 are defined by conventional semiconductor processing methods, for example, wet etch, dry etch or photo-resist lift-off. The platinum layer 52 is not affected by a wet chemical etch and under normal procedure will be removed by a sputter etch, a plasma etch, or lift-off, according to the present invention.

Figure 6:
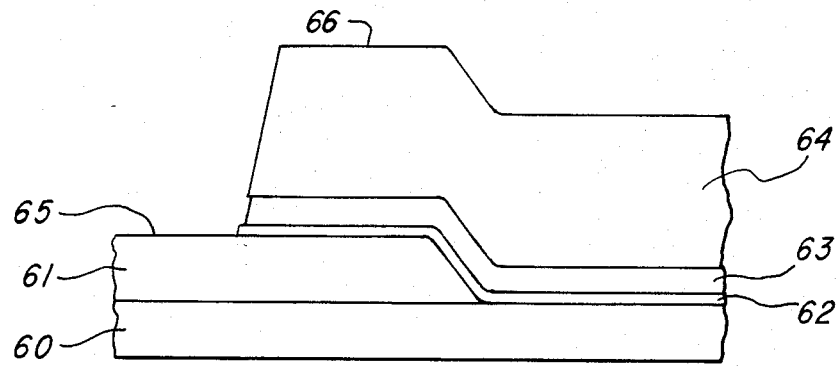
FIG. 6 is a cross-sectional view of a semiconductor substrate having the contact and the metallization defined.

Referring now to FIG. 6, the platinum layer 62 is defined by the use of a second sputter etch which removes all the platinum on the order of 100 to 1000 angstroms. Note also that a similar amount of material is removed from the entire surface of the slice. However, the aluminum layer is on the order of more than 10-200 times as thick as the platinum layer. Therefore, the removal of 100 to 1000 angstroms of material from the aluminum does not significantly affect its sheet resistivity and at the same time this sputter etch provides for a very clean silicon dioxide surface shown at 65. As previously stated, a normal chemical process can possibly leave material between interconnects which will allow shorts to occur. The present process removes material from the entire surface and leaves a clean insulator between contacts.

Figure 7:
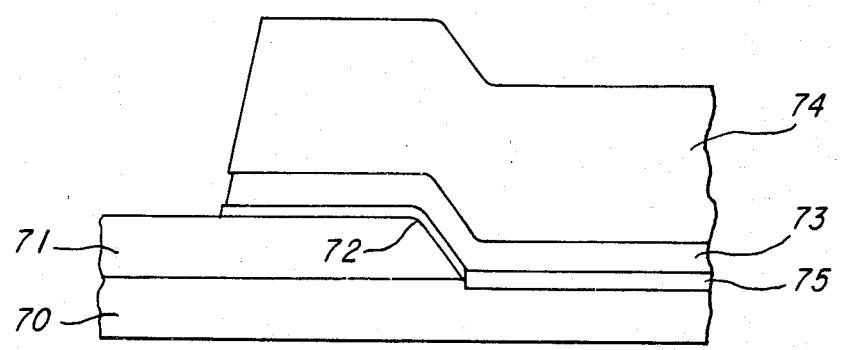
FIG. 7 illustrates a Schottky contact subsequent to sintering wherein the silicon substrate is partially covered by a layer of silicon oxide and portions of both the oxide and the silicon are covered by a multilayered metallization layer, the portion overlying the silicon having been sintered to form platinum silicide at the silicon surface.

Referring now to FIG. 7, the slice is heated at this point to provide both the anneal and sintering of the platinum to form platinum silicide 75 on the surface of semiconductor substrate 70. The silicon oxide 71 does not significantly react to form silicide with the platinum, however, it is possible that upon sputter deposition and/or sintering the platinum that a very thin layer of platinum silicide is formed with unconnected silicon molecules on the surface which would be remaining after the initial sputter etch step.

The chamber utilized was an MRC-603 metal deposition system, pumped down to between 2 to 20 millitorr, and having an argon source leaked into the chamber. Sputter etch power was approximately 500 watts, and platinum deposition sputter power was approximately 400 watts.

This process results in a very good adhesion between the platinum and the silicon oxide, as well as between the titanium tungsten and platinum and aluminum and titanium tungsten. The titanium-tungsten normally forms a good adhesion to silicon oxide without processing difficulties, however, the use of sputter etch on the silicon oxide followed by a platinum sputter deposition without exposing the oxide to oxygen provides an extremely good adherent metallic film. Experiments have shown a similar effect on the surface of silicon nitride.

This process saves a separate furnace step which is no longer required for the aluminum anneal and saves the manufacturing facility from the hazards of use of aqua regia in the process.

Furthermore, since the slice is normally processed while in the sputtering chamber and is moved less often, there is a reduction in process time.

Furthermore, the contact, in this case a Schottky contact, is less often exposed to contamination.

An additional benefit occurs in that a residue between leads (believed to be a titanium or tungsten compound) is not produced and on the contrary, the area between contacts is thoroughly scoured by the second sputter etch, or plasma etch.

Since the aqua regia etch is eliminated, the process is safer for personnel, less expensive, and requires less equipment. An additional benefit of the present process is the elimination of a sputter etch prior to the titanium tungsten deposition. This etch is normally required after the platinum silicide is exposed to oxygen to remove any oxide on the surface of the silicide. This often produces an exposed substrate surface adjacent to the silicide since the silicon oxide is preferentially removed at the edges of the contact. Since the sputter etch just prior to titanium tungsten deposition is eliminated, oxide is not removed from around the edge of the platinum silicide. Therefore, a titanium tungsten Schottky contact will not be formed in parallel with the platinum silicide Schottky contact. This results in an improved predictability of the Schottky forward conduction voltage. The older process having the sputter etch prior to titanium tungsten deposition was observed to vary typically by as much as 15% due to the secondary titanium tungsten Schottky contact. The present invention, however, reduced the Schottky forward conduction voltage to a typical variation of less than 1.8% from slice to slice.

Although platinum forms $Pt_2Si$ as well as PtSi it should be noted that it is predicted that other metals capable of forming stable silicides will form adherent films on the surface of the sputter etched silicon oxide or silicon nitride as well. Metals which will work under these circumstances are listed in table 10.1 on page 375 of the Incorporated Chapter 10, Silicide Formation of the Text, Thin Films; Interdiffusion and Reactions edited by J. M. Poate, K. N. Tu and J. W. Mayer, that chapter which has been incorporated herein by reference is descriptive of the mechanism of silicide formation and provides a good basis upon which the present invention improves.

Other modifications of the disclosed processes may become apparent to persons skilled in the art without departing from the spirit and scope of the invention as defined by the appended claims.

What is claimed is:

1. A process for forming an electrical interconnection system on a semiconductor comprising the steps of:
   a. providing a silicon substrate;
   b. forming on the surface of said substrate, a layer of silicon dioxide or silicon nitride;
   c. defining contact openings on said substrate through said oxide or said nitride;
   d. sputter etching to remove a surface layer from the silicon oxide or nitride and the silicon substrate;
   e. depositing a layer of platinum over the entire semiconductor surface including the oxide or nitride;
   f. depositing a layer of barrier metal on said platinum layer;
   g. depositing a layer of conducting metal on said barrier metal layer;
   h. defining said metal interconnection system;

i. heating the substrate for annealing and to form platinum silicide in the contact openings.

2. The process of claim 1, wherein said barrier metal comprises titanium-tungsten.

3. The process of claim 1, wherein said conducting metal comprises aluminum.

4. The process of claim 1, wherein step (h) comprises the steps of:
j. removing selected portions of said conducting metal and barrier metal layers with a chemical etch; and
k. removing exposed portions of said platinum layer with a plasma etch.

* * * * *